US008853832B2

(12) United States Patent
Cantoni

(10) Patent No.: US 8,853,832 B2
(45) Date of Patent: Oct. 7, 2014

(54) METHODS AND APPARATUS FOR REDUCING COUPLING IN A MOS DEVICE

(75) Inventor: Adalberto Cantoni, San Jose, CA (US)

(73) Assignee: STMicroelectronics Inc., Coppell, TX (US)

( * ) Notice: Subject to any disclaimer, the term of this patent is extended or adjusted under 35 U.S.C. 154(b) by 889 days.

(21) Appl. No.: 12/358,015

(22) Filed: Jan. 22, 2009

(65) Prior Publication Data

US 2010/0182078 A1  Jul. 22, 2010

(51) Int. Cl.
H01L 23/552 (2006.01)
H01L 23/522 (2006.01)
H01L 29/78 (2006.01)

(52) U.S. Cl.
CPC .......... *H01L 29/78* (2013.01); *H01L 23/5225* (2013.01); *H01L 2924/3011* (2013.01)
USPC ............ 257/659; 267/409; 267/E29.255

(58) Field of Classification Search
CPC ................... H01L 29/78; H01L 2924/3011
USPC ......... 257/659, 758, E21.177, 340, 409, 508, 257/630, 662, 333, 386, E21.19, E29.255
See application file for complete search history.

(56) References Cited

U.S. PATENT DOCUMENTS

| | | | | |
|---|---|---|---|---|
| 4,958,222 | A * | 9/1990 | Takakura et al. | 257/659 |
| 6,674,121 | B2 * | 1/2004 | Misra et al. | 257/324 |
| 6,784,548 | B2 * | 8/2004 | Kouno et al. | 257/758 |
| 7,576,382 | B2 * | 8/2009 | Ueno | 257/306 |
| 7,812,453 | B2 * | 10/2010 | Kiyota | 257/758 |
| 7,948,015 | B2 * | 5/2011 | Rothberg et al. | 257/253 |
| 2005/0017298 | A1 * | 1/2005 | Xie et al. | 257/336 |
| 2007/0057280 | A1 * | 3/2007 | Hayashi et al. | 257/127 |
| 2007/0224761 | A1 * | 9/2007 | Takami | 438/257 |
| 2008/0006886 | A1 * | 1/2008 | Mehta et al. | 257/401 |
| 2008/0179716 | A1 * | 7/2008 | Liu | 257/659 |
| 2008/0217693 | A1 * | 9/2008 | Wang et al. | 257/352 |

* cited by examiner

*Primary Examiner* — Cuong Q Nguyen
*Assistant Examiner* — Yosef Gebreyesus
(74) *Attorney, Agent, or Firm* — Seed IP Law Group PLLC

(57) ABSTRACT

Mutual capacitances between regions of a MOS device become substantial factors that limit the speed and performance of the device as the device dimensions are reduced in size. A MOS transistor with a shielding structure formed above the gate is described. The shielding structure is connected to ground and is configured to reduce at least some of these mutual capacitances.

17 Claims, 6 Drawing Sheets

METHODS AND APPARATUS FOR REDUCING COUPLING IN A MOS DEVICE

BACKGROUND OF THE INVENTION

1. Field of the Invention

The present invention relates generally to semiconductor design, and more specifically to a MOS layout with reduced coupling between the terminals of the MOS device.

2. Discussion of the Related Art

Metal-oxide semiconductor field effect transistors (MOSFETs) are used as discrete devices and as active elements in digital and analog integrated circuits (ICs) for a variety of applications ranging from microprocessors and memory to communications devices. A block diagram representation of a cross-sectional view of a conventional MOS structure is illustrated in FIG. 1. The semiconductor portion of the MOS structure 100 includes a drain region 102, a channel region (bulk) 104, and a source region 106. MOSFETs can be either n-channel or p-channel devices. In an n-channel MOSFET, the substrate 101 is a p-type semiconductor (e.g., silicon) and the drain region 102 and the source region 106 are n+ doped regions. MOSFET 100 also includes a gate 108 disposed above the channel region 104. In conventional MOSFETs, the gate 108 is separated from the channel region 104 by an insulating layer (e.g., silicon dioxide). As a voltage is applied to the gate 108, the conductive properties of the channel region 104 below the gate 108 change to form a channel in the channel region 104 through which electrons (in an n-type device) or holes (in a p-type device) may flow between the source region 106 and the drain region 102.

Metallization layers are typically formed above the semiconductor portion of the MOS structure to establish electrical connection between the regions of the MOS device. Electrical contacts are also formed to provide electrical access to the device terminals. For example, electrical access to the source region 106 is provided via a source contact 110 that connects a first metallization layer 112, a second metallization layer 114, and a third metallization layer 116. Similarly, access to the drain region 102 is provided via a drain contact 120 that connects a first metallization layer 122, a second metallization layer 124, and third metallization layer 126.

The placement of source contacts 110 and drain contacts 120 in MOSFET 100 is more clearly illustrated in FIG. 2 which shows a top-view of the MOS device 100. As shown in FIG. 2, MOSFET 100 may include multiple source contacts 110 arranged along the source region 106, and multiple drain contacts 120 arranged along the drain region 102. The relative proximity of the metal contacts to the gate 108 and to each other results in coupling between the regions of the MOS device, as represented by the capacitances illustrated in FIGS. 1 and 2. For example, the proximity of the source contact 110 and the drain contact 120 to the gate 108 establishes a respective source contact-gate capacitance 130 and a drain contact-gate capacitance 132.

The proximity of the different metallization layers to the regions of the MOSFET 100 results in additional coupling. For example, a first metallization layer (M1) 112 above the source region 106 couples the gate 108 to the source region 106 (the coupling is represented by gate-source parasitic capacitance 134). Similarly, the first metallization layer (M1) 122 above the drain region 102 couples the gate 108 to the drain region 102 (as represented by the drain-gate parasitic capacitance 136). The M1 layers 112 and 122 additionally couple the drain region 102 to the source region 106 via mutual coupling represented by the drain-source capacitance 140.

Each of the higher metallization layers (e.g., M2 and M3) further couples the drain region 102 to the source region 106. The amount of mutual coupling is related to the spatial distribution of the electrical contacts in the MOS device 100, as shown by drain-source capacitance 142 between M2 layers 114 and 124, and drain-source capacitance 144 between M3 layers 116 and 126. Each of these higher metallization layers also establishes a weak parasitic coupling between their respective drain/source region and the gate 108. However, this parasitic coupling becomes significantly weaker at further distances (i.e., the further the metallization layer is from the gate 108, the weaker the parasitic coupling will be). The source-drain mutual coupling between the M3 metallization layers is also illustrated in the top-view of FIG. 2 as drain-source mutual capacitances 144.

SUMMARY OF THE INVENTION

At least one embodiment of the invention is directed to a method of making a MOS transistor. The method comprises forming a conductive gate structure above a gate dielectric and forming a shielding structure above the conductive gate structure.

At least one embodiment is directed to an amplifier, comprising at least one MOS transistor comprising a conductive gate and a shielding structure disposed above the conductive gate.

At least one embodiment is directed to a method for reducing a capacitance between at least two terminals of a MOS device comprising a drain region, a source region, and a conductive gate. The method comprises disposing a shielding structure above the conductive gate.

At least one embodiment is directed to an apparatus, comprising a load circuit and at least one source follower circuit coupled to the load circuit the at least one source follower circuit comprising at least one MOS transistor comprising a shielding structure disposed above a conductive gate structure.

At least one embodiment is directed to a MOS transistor comprising a conductive gate and a shielding structure coupled to the conductive gate, wherein the shielding structure is configured to reduce a capacitance between at least two terminals of the MOS transistor.

It should be appreciated that all combinations of the foregoing concepts and additional concepts discussed in grater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF THE DRAWINGS

The accompanying drawings are not intended to be drawn to scale. In the drawings, each identical or similar component that is illustrated in various figures is represented by a like reference character. For purposes of clarity, not every component may be labeled in every drawing. In the drawings.

DETAILED DESCRIPTION

Embodiments of the present invention relate to a shielding structure for a MOS device to reduce at least some coupling between the terminals of the MOS device. The incorporation of a shielding structure above the gate of a MOS device as disclosed herein, reduces the coupling between terminals of the device to realize a MOS device with increased switching times despite reduced dimensions, and that may be suitable in some low-power applications Applicants have recognized and appreciated that as the dimensions of a MOS device become smaller, the coupling between the regions of a MOS device become more problematic (i.e., the coupling increases) as the distances between the components of the device decreases. Thus, according to some embodiments of the invention, a shielding structure is provided above the gate of a MOS device to reduce at least some of the coupling between the regions of the device.

Figure 3:
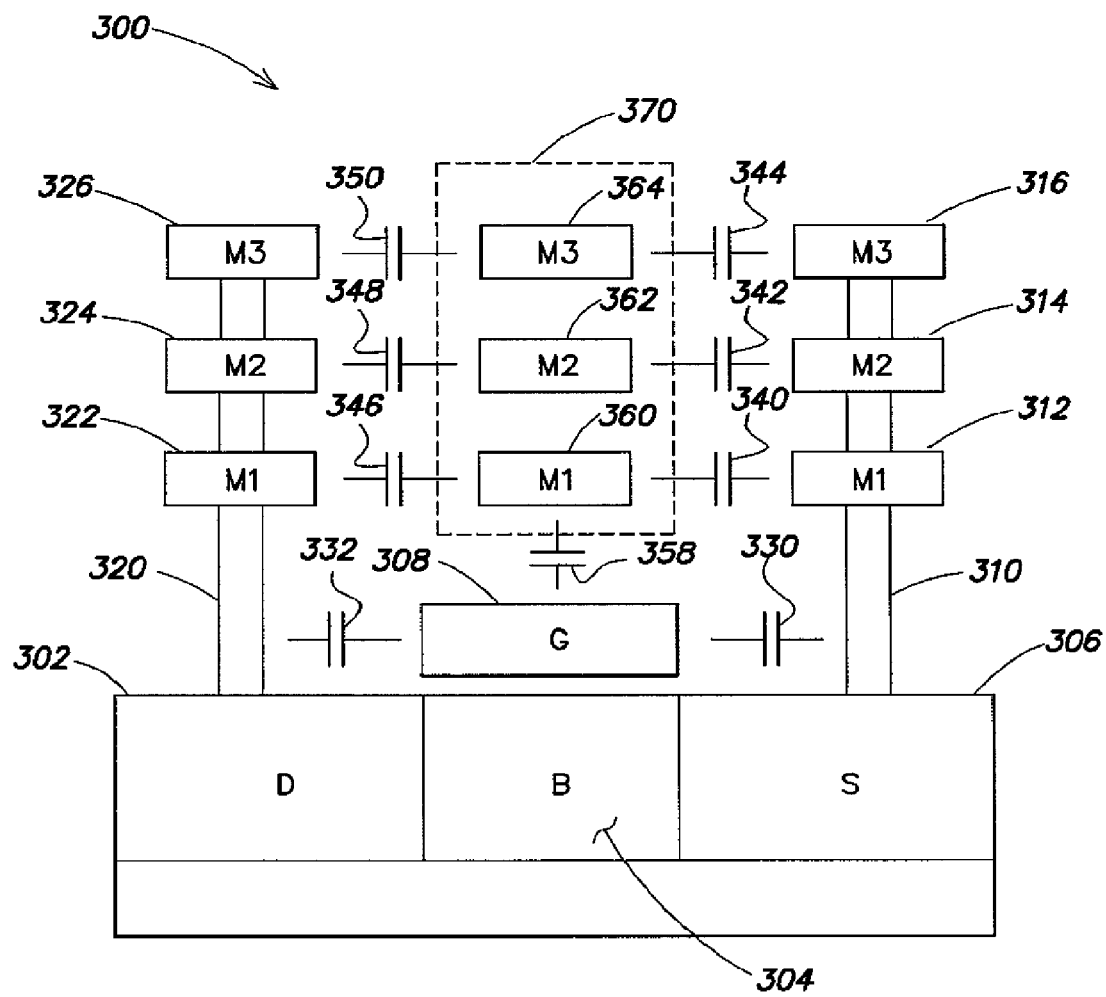
FIG. 3 is a block diagram of a cross-sectional view of a MOS device with a shielding structure in accordance with at least one embodiment of the invention.

An embodiment of the invention is illustrated schematically in FIG. 3. In this embodiment, a shielding structure 370 is disposed above the gate 308. The shielding structure 370 may be coupled to ground (not shown) to reduce the parasitic capacitance between regions of the MOS device (e.g., by providing an alternate path to ground). As shown in FIG. 3, the shielding structure 370 may comprise a first (M1) shielding layer 360 which acts to reduce the coupling between the source region 306 and the drain region 302 in the first metallization (M1) layer 312, 322 above the source region 306 and the drain region 302. Additionally, the M1 shield 360 reduces the parasitic capacitance between the source region 306 and the gate 308 by establishing a coupling between the M1 shield 360 and the M1 metallization layer 312 to redirect some of the source-gate parasitic capacitance to ground. Similarly, the M1 shield 360 reduces the parasitic capacitance between the drain region 302 and the gate 308 by establishing a coupling between the M1 shield 360 and the M1 metallization layer 322 to redirect some of the drain-gate parasitic capacitance to ground. As should be appreciated from the foregoing, the M1 shield 360 has a double functionality of reducing a drain-source mutual coupling and reducing a parasitic capacitance between the drain/source and the gate.

In some embodiments, shielding structure 370 may comprise additional layers of shielding corresponding to the higher level metallization layers formed above the source region 306 and the drain region 302, as aspects of the invention are not limited in this respect. For example, in one embodiment, shielding structure 370 may comprise a second (M2) shielding layer that is configured to reduce a mutual coupling between the source region 306 and the drain region 302 by forming additional mutual couplings between the M2 layer 314 and the M2 shield 362 (i.e., represented by capacitance 342) and between the M2 layer 324 and the M2 shield 362 (i.e., represented by capacitance 348). It should be appreciated that the M2 shield 362 also provides shielding to reduce a parasitic capacitance between the M2 layers 314, 324, and the gate 308. However, as discussed earlier, the effect of drain-gate and/or source-gate parasitic capacitance is expected to be greatest for the metallization layer closest to the gate (i.e., M1), with this effect diminishing for higher-level metallization layers.

In some embodiments, shielding structure 370 comprises a third (M3) shield layer 364 for further reducing a mutual coupling between the source region 306 and the drain region 302 by establishing mutual couplings between the M3 layer 316 and the M3 shield 364 (i.e., represented by capacitance 344) and between the M3 layer 326 and the M3 shield (i.e., represented by capacitance 350).

Although the illustrative example of FIG. 3 shows three levels of metallization and three corresponding layers of shielding in shielding structure 370, it should be readily appreciated that any number of metallization levels and/or shielding layers may be used, as embodiments of the invention are not limited in this respect. For example, in some embodiments where reducing parasitic capacitance (e.g., drain-gate or "Miller" capacitance) is desirable, only a single (e.g., M1) layer of shielding may be provided, although any number of shielding layers, including three layers as shown in FIG. 3, may alternatively be used. In embodiments for which the number of shielding layers is less that the number of metallization levels, the remaining space between the drain contact structure(s) and the source contact structure(s) above the gate may be filled with one or more oxide layers as discussed in more detail below.

Figure 1:
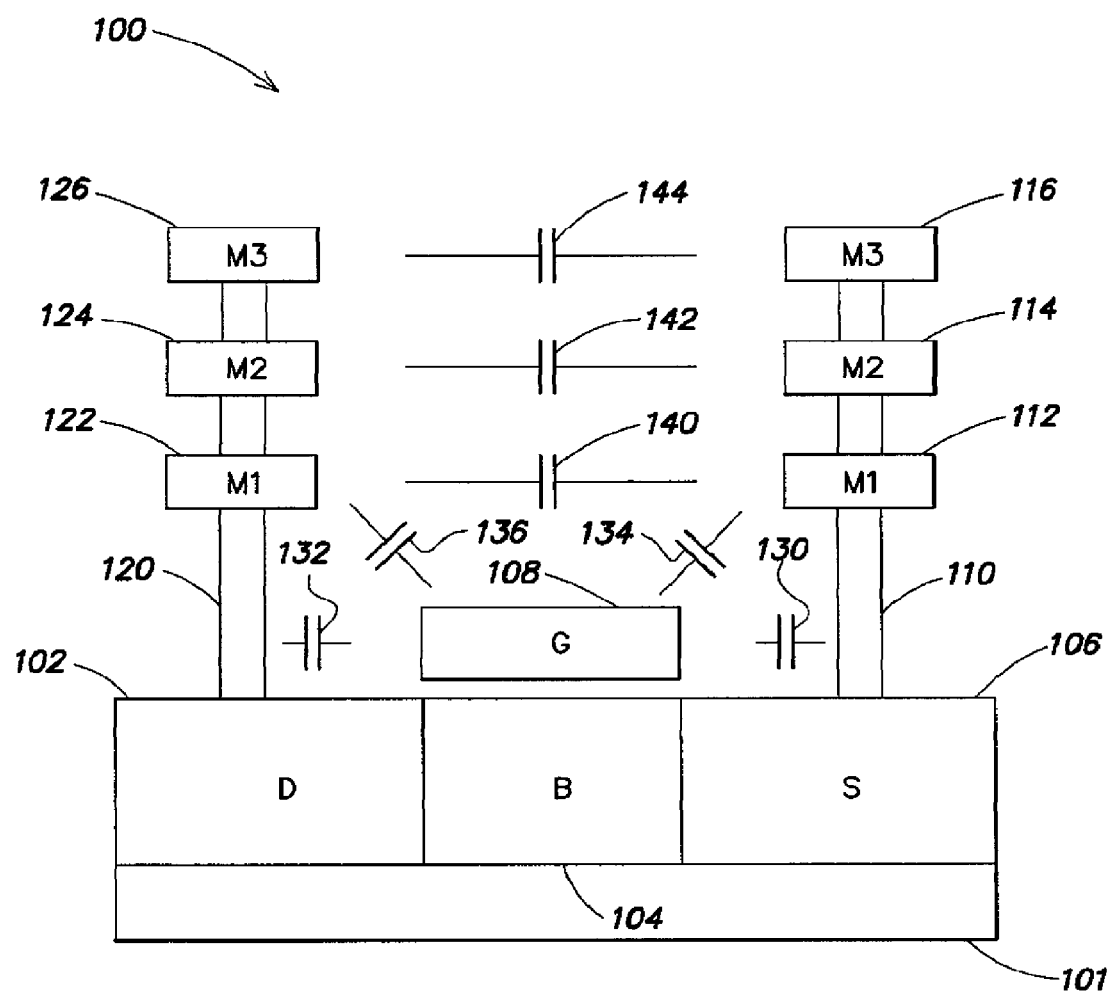
FIG. 1 is block diagram of a cross-sectional view of a conventional MOS device.
Figure 2:
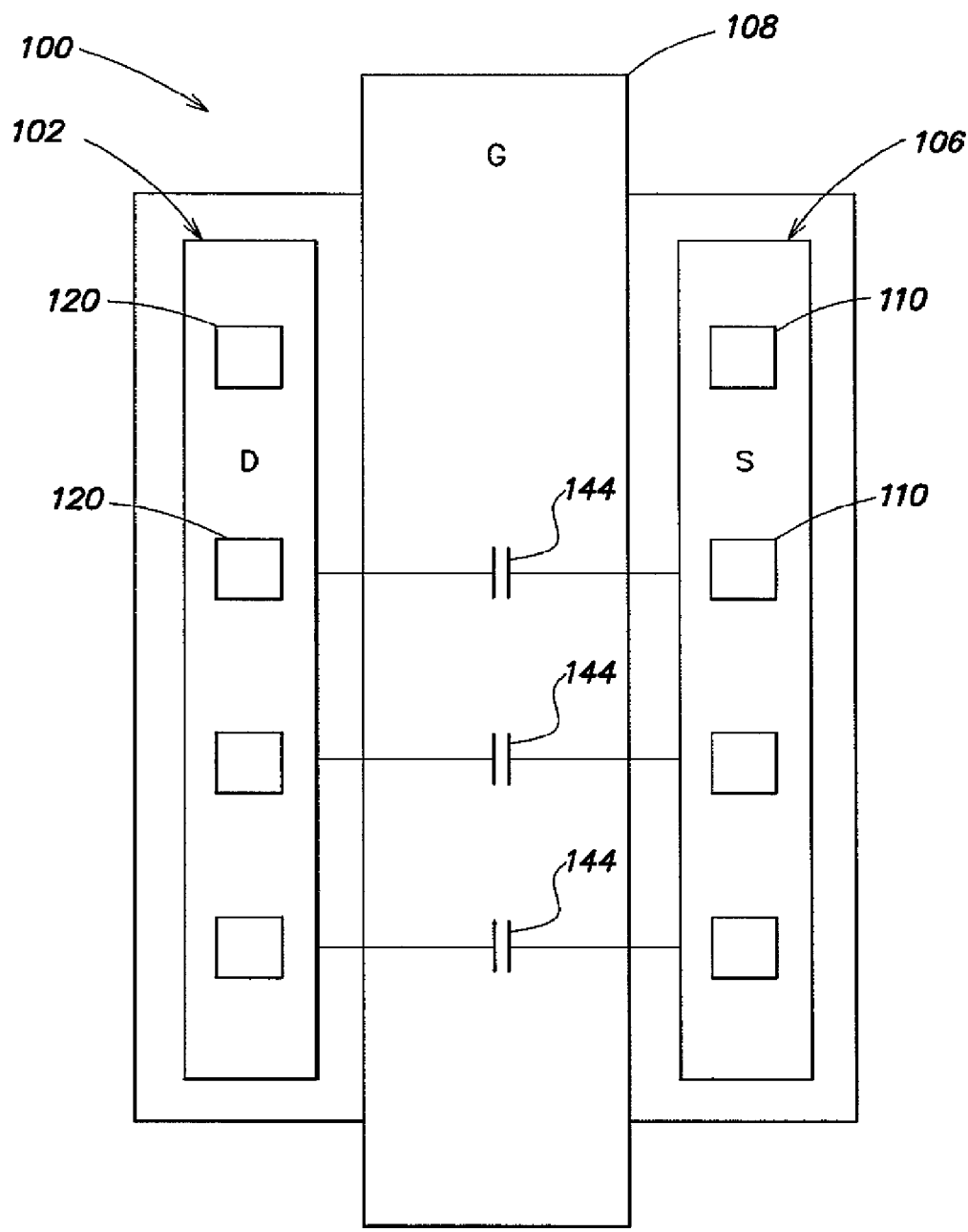
FIG. 2 is a top view of the MOS device shown in FIG. 1.
Figure 4:
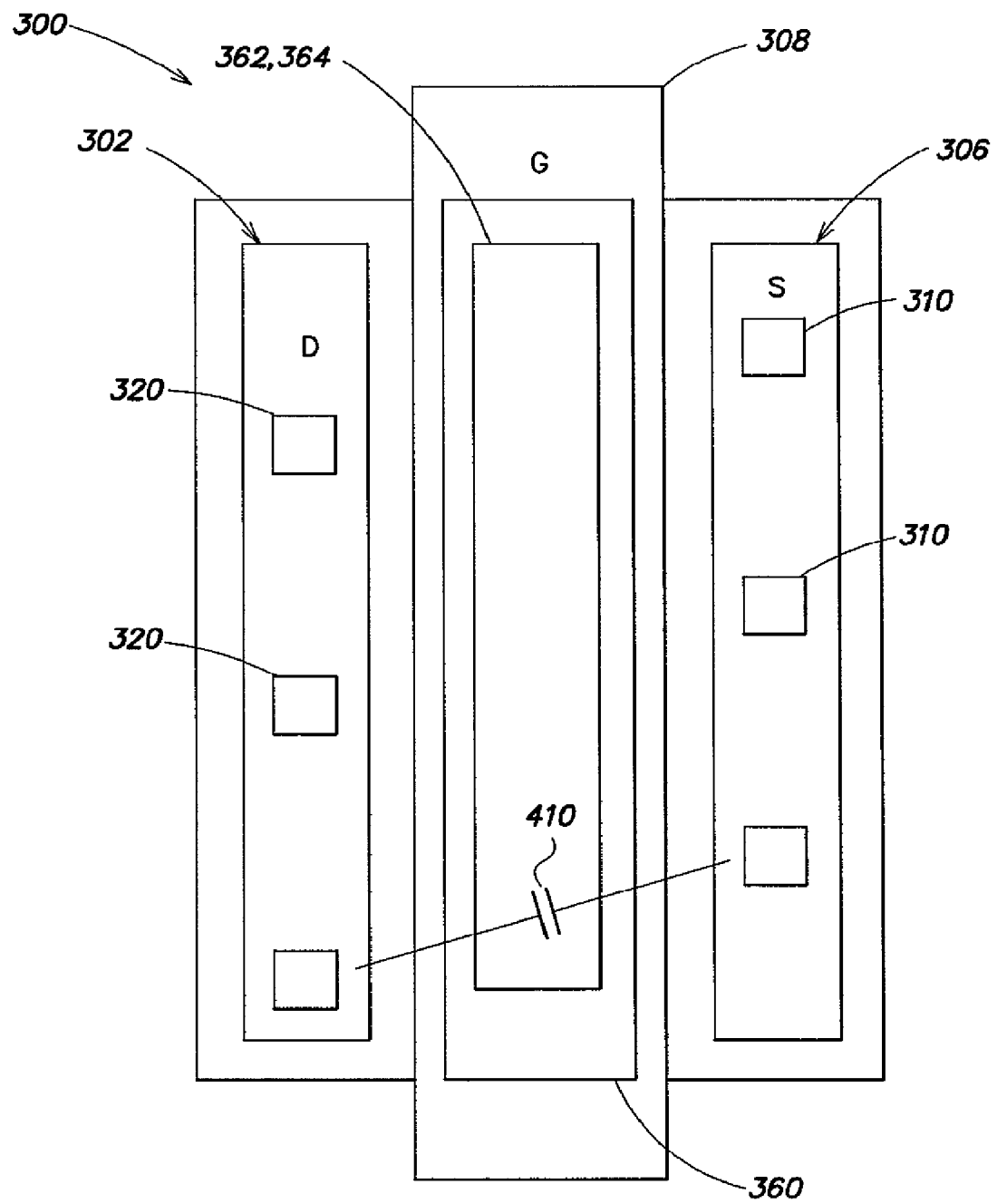
FIG. 4 is a top-view of the MOS device shown in FIG. 3.

A top-view of the MOS structure 300 of FIG. 3 is shown in FIG. 4. As shown in FIG. 4, MOS structure 300 may comprise a plurality of electrically-isolated source contacts 310 and a plurality of electrically-isolated drain contacts 320 arranged above the respective source region 306 and drain region 302. In some embodiments, source contacts 310 and drain contacts 320 may be spatially configured so that pairs of contacts are directly across from each other (e.g., see the configuration of FIG. 2). Such a parallel arrangement allows for a higher number of contacts to be used. However, a parallel configuration also results in increased coupling between the source region 306 and the drain region 302, and particularly when the distance between pairs (source-drain) of contacts becomes small with reduced dimensions of the MOS device. Accordingly, at least a portion of the mutual coupling between the source region 306 and the drain region 302 (e.g., created by the proximity of the source contacts 310 and the drain contacts 320) may be reduced by the use of the shielding structure 370 in accordance with embodiments of the invention, as described above.

Alternatively (or in addition to the shielding structure 370), in some embodiments, a reduced number of contacts may be used, wherein the contacts are spatially misaligned to form an anti-parallel configuration as illustrated in FIG. 4. An anti-parallel configuration of electrical contacts for a MOS device 300 as shown in FIG. 4 increases the distance between pairs of contacts (e.g., compared to the parallel configuration of FIG. 2), further reducing the mutual coupling between the source region 306 and the drain region 302 (i.e., the value of the capacitance 410 is less than the value of the capacitance 144 shown in FIG. 2 because the distance between the respective contacts is greater).

To assess the change in parasitic capacitance between the drain, source, and the gate of a MOS device, an exemplary MOS device was modeled under three conditions: conventional MOS structure with aligned contacts (e.g., FIG. 2), MOS structure with misaligned contacts (no shielding), and shielded MOS structure, as described in detail above. The parasitic capacitance extraction results are illustrated in Table 1.

TABLE 1

| MOS<br>W = 20μ,<br>L = 0.28μ | MOS structure<br>with aligned<br>contacts and<br>no shielding | MOS structure with<br>misaligned contacts<br>and no shielding | MOS structure with<br>misaligned contacts<br>and shielding |
|---|---|---|---|
| Drain/Source | 1.563 fF | 1.50 fF | 0.320 fF |
| Drain/Gate | 1.04 fF | 1.02 fF | 0.783 fF |
| Source/Gate | 2.23 fF | 2.21 fF | 1.9 fF |

As can be seen from Table 1, the misalignment of the contacts (i.e., Table, 1, column 2) provides a small decrease in the mutual capacitances between the different regions of the MOS device when compared to the MOS device with aligned contacts (Table 1, column 1). This small decrease may be due, at least in part, to the increased distance between the contacts as described above. In contrast, the addition of the shielding structure to the MOS device (i.e., Column 3) results in large decreases in the mutual capacitances between the different regions of the MOS device. In particular, the direct coupling between the drain and source is drastically reduced in the presence of the shielding structure. The drain-gate and source-gate parasitic capacitances are also reduced with the addition of the shielding structure, albeit to a lesser degree than the drain-source capacitance. As seen from Table 1, the source-gate coupling benefits more from the shielding (i.e., the coupling is reduced more) than the drain-gate coupling because the source contacts are located closer to the gate (i.e., the source-gate parasitic capacitance is larger than the drain-gate parasitic capacitance even without shielding).

Some embodiments of the invention are directed to an apparatus with multiple shielded MOS structures (e.g., a multi-stage amplifier or a power cell). To assess the change in parasitic capacitance between the drain, source, and the gate of a multi-module apparatus comprising multiple MOS devices, an exemplary multi-module MOS apparatus was modeled under three conditions: multiple-module apparatus with conventional MOS structure with aligned contacts (e.g., FIG. 2), multiple module apparatus with shielded MOS structure, and multiple module apparatus with shielded MOS structure and misaligned contacts. The parasitic capacitance extraction results are illustrated in Table 2.

TABLE 2

| MOS<br>W = 1600μ,<br>L = 0.28μ | Conventional<br>MOS<br>with aligned<br>contacts | MOS with shielding<br>and aligned contacts | MOS with shielding<br>and misaligned<br>contacts |
|---|---|---|---|
| $C_{ds}$ | 177.9 fF | 0 fF | 10 fF |
| $C_{ds}$ | 167.8 fF | 138.9 fF | 45.3 fF |
| $C_{ds}$ | 172.57 fF | 147 fF | 49 fF |
| Drain/ground | 43.5 fF | 612 fF | 441 fF |
| Gate/ground | 1.9 fF | 75 fF | 95.3 fF |
| Source/ground | 51.7 fF | 608 fF | 421 fF |

As can be seen from Table 2, a multiple-module apparatus incorporating shielded MOS devices, according to embodiments of the invention, provides drastically reduced coupling between the drain and source regions of the MOS device. The drain-gate capacitance (also known as the "Miller" capacitance) is reduced in the extracted multi-module layout. This reduction in Miller capacitance may enable some shielded MOS devices, in accordance with embodiments of the invention, to be used as amplifiers having a higher input bandwidth compared to conventional MOS based amplifiers, as discussed in more detail below.

The shielding structure 370 may be formed in any suitable way, as aspects of the invention are not limited in this respect. In a conventional manufacturing process for MOS device, the formation of metallization layers to provide electrical connections for different regions of the device may proceed in a series of steps. For example, In a first step, the first metallization layer (M1) may be deposited (e.g., via a sputtering process, evaporation process, or some other technique). In a second step, a mask (e.g., a photoresist mask) may be applied to surface of the M1 layer, and the metal may be removed (e.g., via etching or some other technique) from some regions of the device that were not covered by the mask. For example, metal may be removed from above the gate and/or from locations in the metallization layers where one or more vias are to be formed. These two steps may be repeated for the higher-level metallization layers until the desired number of metallization layers are formed. An oxide layer may then be grown on top of the device to form a planar surface (i.e., the valleys created by the etching process may be filled in with oxide).

According to some embodiments of the invention, the shielding structure 370 may be formed by using a different mask than in the conventional process, that "leaves behind" one or more metal layers disposed above the gate to form the shielding structure 370. Alternatively, the portion of the MOS device comprising the shielding structure 370 may be etched in accordance with a conventional fabrication process, and the shielding structure 370 may be formed using one or more additional steps. It should be appreciated, however, that the shielding structure 370 may be formed in any suitable way, as aspects of the invention are not limited in this respect. Furthermore, although the examples provided herein describe shielding layers comprising the same metal material as the respective metal layers used to form the metallization layers, aspects of the invention are not limited in this way, and any suitable shielding material may be used.

The reduced coupling afforded by the shielding structure of a MOS device in accordance with embodiments of the invention facilitates the use of such MOS devices with a variety of applications. For example, some embodiments of the invention are directed to an amplifier comprising at least one MOS device with a shielding structure disposed above the gate.

Figure 5:
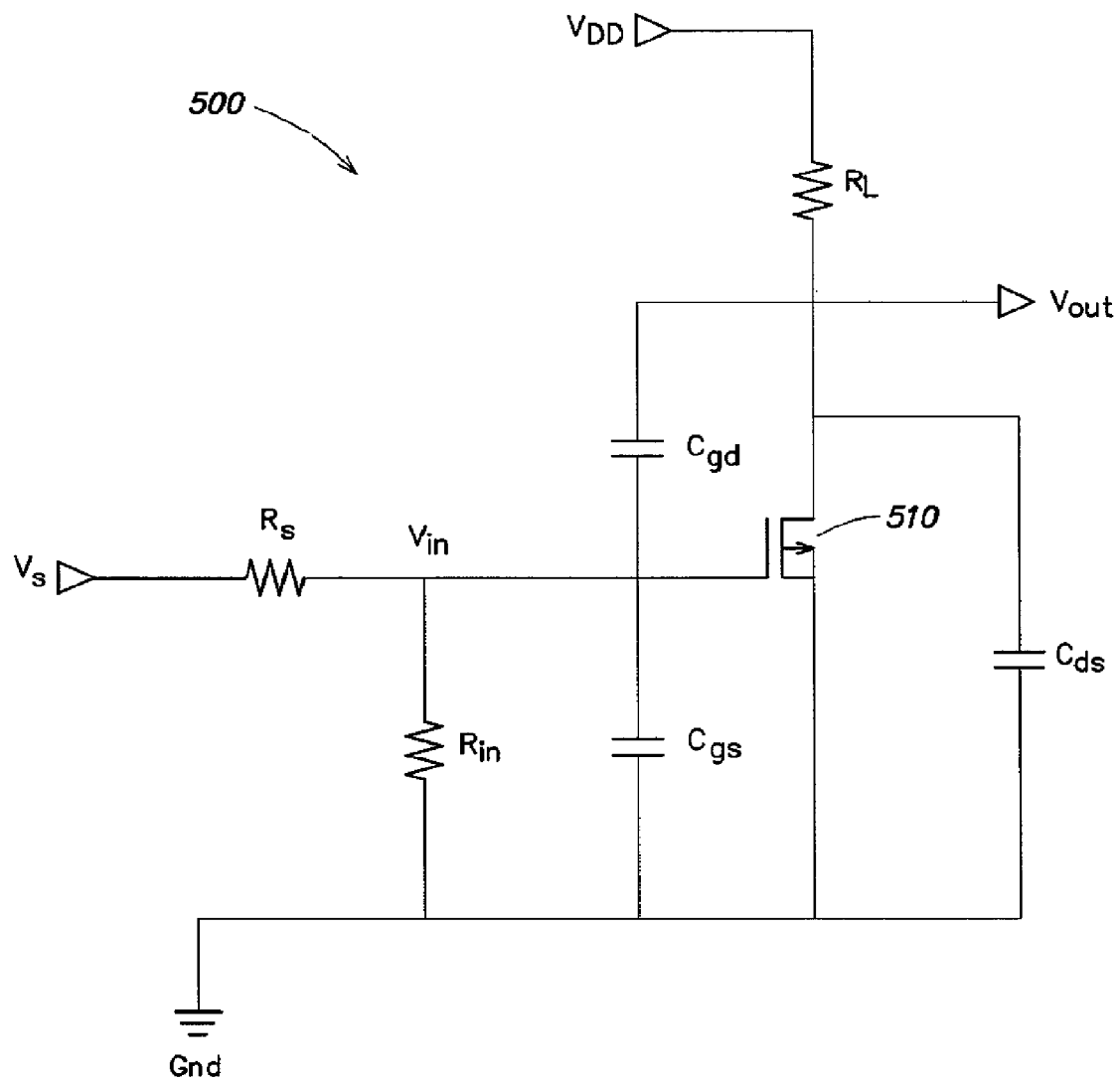
FIG. 5 is a circuit schematic of an amplifier for use with at least one embodiment of the invention.

Applicants have recognized and appreciated that amplifiers are generally realized in a common source configuration where the input bandwidth suffers from the "Miller" effect (i.e., the parasitic capacitance between the drain and the gate or $C_{gd}$). A circuit schematic of an exemplary amplifier 500 comprising a shielded MOS transistor 510 in accordance with some embodiments of the invention is illustrated in FIG. 5. In the configuration shown in FIG. 5 the effective input capacitance is defined as $C_{in}=C_{gs}+(1-A)C_{gd}+C_{gb}$, where $A=-gmR_L$ is the gain of an amplifier stage with a load resistance $R_L$. The input bandwidth of this configuration is defined as $1/(2\pi R_{in}C_{in})$, where $C_{in}$ is the input capacitance and $R_{in}$ is the input impedance equal to the source impedance. In an exemplary amplifier circuit with a gain of 20 (i.e., 26 dB), the input capacitance $C_{in}$ may be approximately 22 pF resulting in an input bandwidth of approximately 289 MHz for a conventional MOS device (i.e., without shielding). However, it is anticipated that the addition of a shielding structure to the MOS device, in accordance with embodiments of the invention, may reduce $C_{in}$ to approximately 20 pF, resulting in a corresponding increase in the input bandwidth to 319 MHz (i.e., roughly a 10% improvement in bandwidth). As should be appreciated from the foregoing equations and FIG. 5, amplifiers with higher gain stages will result in additional improvement in the input bandwidth since $C_{gd}$ is multiplied by the gain A.

Figure 6:
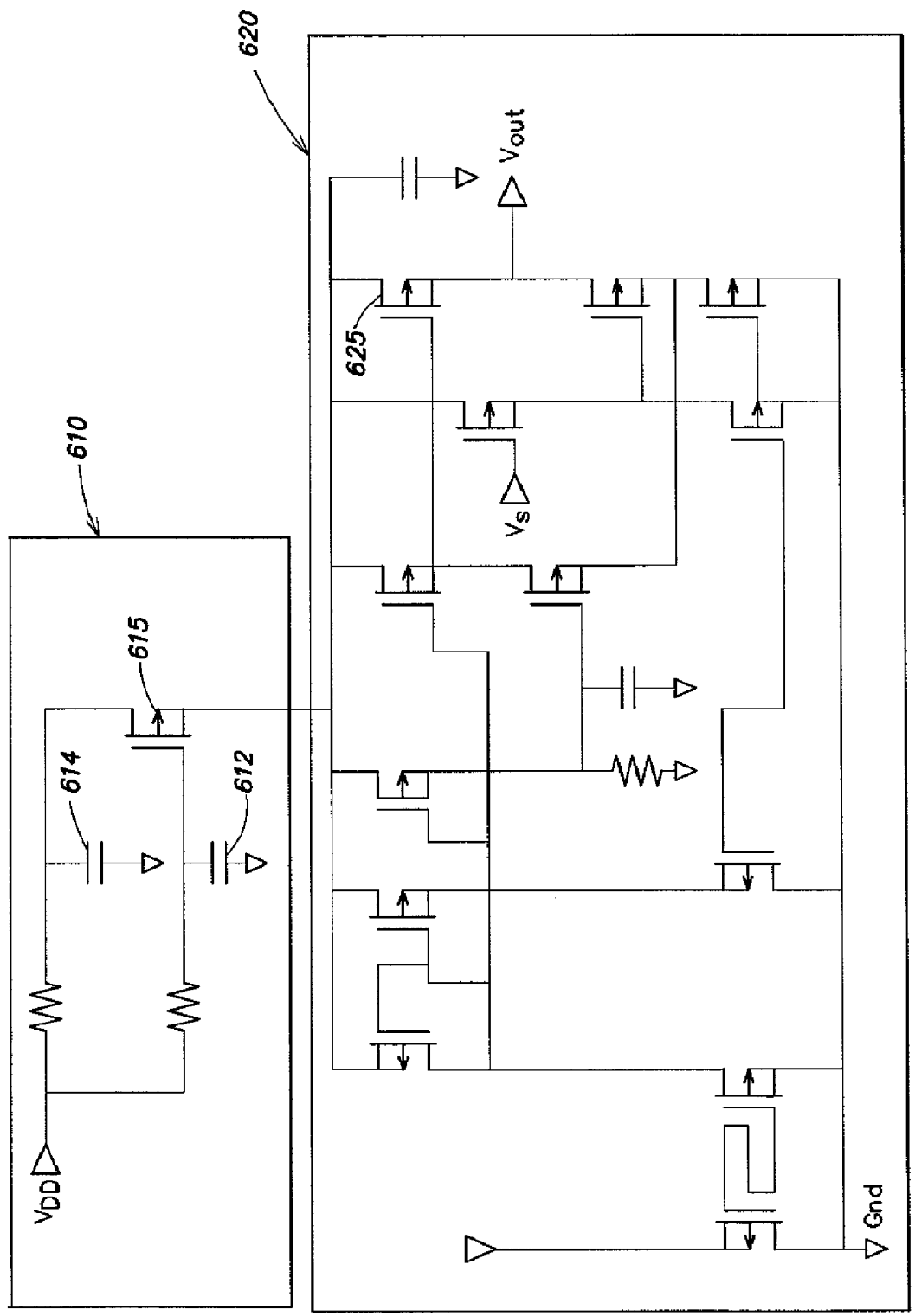
FIG. 6 is a schematic of a circuit in which at least one embodiment of the invention may be incorporated.

Applicants have also recognized that some embodiments of the invention may be used with a power supply to improve the noise rejection of the power supply. One method of suppressing the effect of supply noise is to interpose a cascode transistor 610 between the power supply $V_{DD}$ and a load circuit 620 to provide shielding as shown in FIG. 6. In such a configuration, the effective supply voltage of the load circuit 620 is isolated. DC rejection in the circuit of FIG. 6 may be defined as the ratio of the effective impendence of the load circuit 620 to the $R_{ds}$ of the cascode transistor 610. However, high frequency rejection is characterized by the $C_{ds}$ to decoupling capacitance ratio. Accordingly, the rejection of high frequency noise in some applications is poor, in part, because the drain-source coupling is large.

Furthermore, additional noise coupling from the gate to the source may result from the limited rejection on the gate bias. At high frequencies, the capacitance $C_{gd}$ acts as a short and couples the supply noise to the gate, which then couples directly to the source as a result of the source follower action of the cascode transistor 610. Thus, Applicants have recognized and appreciated that rejection of the supply noise may be improved by increasing the gate-ground capacitance 612 and the source-ground capacitance (i.e., these capacitances act as filters which eliminate high-frequency noise), and by reducing the mutual capacitances $C_{gd}$, $C_{gs}$, and $C_{ds}$. According to some embodiments of the invention, at least the transistors 615 and 625 may be replaced with MOS devices having a shielding structure as described in detail above. Incorporation of such MOS devices increases source and gate capacitances with respect to ground and reduces the mutual capacitances between the gate, drain, and source of the devices thereby providing for improved supply noise rejection.

In some embodiments, load circuit 620 may be an open loop buffer circuit for a regulator as shown in FIG. 6. However, it should be appreciated that load circuit 620 may be any suitable type of circuit that may benefit from improved supply noise rejection, as embodiments of the invention are not limited in this respect.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of making a MOS transistor, the method comprising:
    forming a conductive gate structure above a gate dielectric; and
    forming at least a portion of a shielding structure directly above the conductive gate structure, wherein the shielding structure includes a first shielding layer and a second shielding layer spatially-overlapping the first shielding layer, wherein the first shielding layer is associated with a first metallization layer of a plurality of metallization layers formed above the MOS transistor and the second shielding layer is associated with a second metallization layer of the plurality of metallization layers, wherein the shielding structure is electrically-coupled to a reference voltage to reduce a drain-source mutual capacitance between a drain terminal and a source terminal of the MOS transistor, wherein a width dimension of the shielding structure is less than or equal to a width dimension of the conductive gate structure.

2. The method of claim 1, wherein forming the shielding structure comprises forming the first shielding layer comprising a first metal material, wherein the first shielding layer is configured to reduce a drain-gate capacitance, a source-gate capacitance, or a drain-gate capacitance and a source-gate capacitance.

3. The method of claim 2, wherein forming the shielding structure comprises forming the second shielding layer comprising a second metal material.

4. The method of claim 3, wherein forming the shielding structure comprises forming a third shielding layer comprising a third metal material, wherein the third shielding layer is configured to further reduce the drain-source mutual capacitance between the drain terminal and the source terminal of the MOS transistor.

5. The method of claim 1, further comprising:
    forming at least one source contact coupled to a source terminal of the MOS transistor; and
    forming at least one drain contact coupled to a drain terminal of the MOS transistor.

6. The method of claim 5, wherein the at least one source contact and the at least one drain contact are spatially aligned.

7. The method of claim 5, wherein the at least one source contact and the at least one drain contact are spatially misaligned.

8. The method of claim 1 wherein the shielding structure is configured to reduce a Miller capacitance of the MOS transistor.

9. A method for reducing a capacitance between at least two terminals of a MOS device comprising a drain region, a source region, and a conductive gate, the method comprising:
    disposing at least a portion of a shielding structure directly above the conductive gate, wherein the shielding structure includes a first shielding layer and a second shielding layer spatially-overlapping the first shielding layer, wherein the first shielding layer is associated with a first metallization layer of a plurality of metallization layers formed above the MOS device and the second shielding layer is associated with a second metallization layer of the plurality of metallization layers, wherein the shielding structure is electrically-coupled to a reference voltage to reduce a drain-source mutual capacitance between the drain region and the source region of the MOS device, wherein a width dimension of the shielding structure is less than or equal to a width dimension of the conductive gate.

10. The method of claim 9, wherein the shielding structure reduces a drain-gate capacitance a source-gate capacitance, or a drain-gate capacitance and a source-gate capacitance.

11. The method of claim 9, wherein the MOS device further comprises at least one drain contact coupled to the drain region and at least one source contact coupled to the source region, the method further comprising:
  forming the at least one drain contact and the at least one source contact in a spatially misaligned configuration.

12. The method of claim 9, wherein disposing the shielding structure further comprises:
  depositing at least a first shielding layer above the conductive gate.

13. The method of claim 9, further comprising applying a voltage to the conductive gate of the MOS device to provide a noise-reduced output voltage.

14. A MOS transistor comprising:
  a conductive gate; and
  a shielding structure coupled to the conductive gate, wherein at least a portion of the shielding structure is arranged directly above the conductive gate, wherein the shielding structure is configured to reduce a capacitance between at least two terminals of the MOS transistor, wherein the shielding structure includes a first shielding layer and a second shielding layer spatially-overlapping the first shielding layer, wherein the first shielding layer is associated with a first metallization layer of a plurality of metallization layers formed above the MOS transistor and the second shielding layer is associated with a second metallization layer of the plurality of metallization layers, wherein the shielding structure is electrically-coupled to a reference voltage to reduce a drain-source mutual capacitance between a drain terminal and a source terminal of the MOS transistor, wherein a width dimension of the shielding structure is less than or equal to a width dimension of the conductive gate.

15. The MOS transistor of claim 14, wherein the first shielding layer comprises a first metal material and is arranged to reduce a drain-gate capacitance, a source-gate capacitance, or a drain-gate capacitance and a source-gate capacitance.

16. The MOS transistor of claim 15, wherein the second shielding layer comprises a second metal material.

17. The MOS transistor of claim 16, wherein the shielding structure comprises a third shielding layer comprising a third metal material, wherein the third shielding layer is configured to further reduce the drain-source mutual capacitance between the drain terminal and the source terminal of the MOS transistor.

* * * * *